(12) United States Patent
Gaylord et al.

(10) Patent No.: US 7,994,590 B2
(45) Date of Patent: Aug. 9, 2011

(54) HIGH DIELECTRIC CONSTANT INSULATORS AND ASSOCIATED FABRICATION METHODS

(75) Inventors: Thomas K. Gaylord, Atlanta, GA (US); James D. Meindl, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 829 days.

(21) Appl. No.: 11/669,086

(22) Filed: Jan. 30, 2007

(65) Prior Publication Data
US 2007/0176248 A1    Aug. 2, 2007

Related U.S. Application Data

(60) Provisional application No. 60/763,284, filed on Jan. 30, 2006.

(51) Int. Cl.
*H01L 29/94* (2006.01)
(52) U.S. Cl. ........ 257/410; 257/288; 257/411; 257/368; 257/E21.272
(58) Field of Classification Search .................. 257/410, 257/288, 411, 368, E21.272
See application file for complete search history.

(56) References Cited

U.S. PATENT DOCUMENTS

| 6,897,134 | B2 | 5/2005 | Brask et al. | |
| 2005/0205947 | A1* | 9/2005 | Yu et al. | 257/410 |
| 2007/0102774 | A1* | 5/2007 | Wang et al. | 257/411 |

OTHER PUBLICATIONS

Eisenbeiser et al. Field effect transistors with SrTiO3 gate dielectric on Si, Applied Physics Letters, vol. 76, No. 10, Mar. 6, 2000, pp. 1324-1326.*
Bhattacharya, Pijush et al., "Comparative Study of Amorphous and Crystalline (Ba, Sr) TiO$_3$ Thin Films Deposited by Laser Ablation," Jpn. J. Appl. Phys., vol. 32, Pt. 1, No. 9B, 1993, pp. 4103-4106.
Oates, Anthony S., "Reliability Issues for High-K Gate Dielectrics," Taiwan Semiconductor Manufacturing Corporation, IEEE 2003, pp. 38.2.1-38.2.4.
Kajiyoshi, Koji et al., "Preparation of Tetragonal Barium Titanate Thin Film on Titanium Metal Substrate by Hydrothermal Method," Journal of the American Ceramic Society, vol. 74, No. 2, 1991, pp. 369-374.
Doh, Seok Joo et al., "Improvement of NBTI and Electrical Characteristics by Ozone Pre-Treatment and PBTI Issues in HfAlO(N) High-k Gate Dielectrics," IEEE 2003, pp. 38.7.1-38.7.4.
Kirby, Kevin W., "Alkoxide Synthesis Techniques for Ba TiO$_3$," Mat. Res. Bull., vol. 23, No. 6, 1988, pp. 881-890.

(Continued)

*Primary Examiner* — Junghwa M Im
(74) *Attorney, Agent, or Firm* — Ryan A. Schneider, Esq.; Dean Y. Shahriari; Troutman Sanders LLP

(57) ABSTRACT

High-dielectric-constant (k) materials and electrical devices implementing the high-k materials are provided herein. According to some embodiments, an electrical device includes a substrate and a crystalline-oxide-containing composition. The crystalline-oxide-containing composition can be disposed on a surface of the substrate. Within the crystalline-oxide-containing composition, oxide anions can form at least one of a substantially linear orientation or a substantially planar orientation. A plurality of these substantially linear orientations of oxide anions or substantially planar orientations of oxide anions can be oriented substantially perpendicular or substantially normal to the surface of the substrate such that the oxide-containing composition has a dielectric constant greater than about 3.9 in a direction substantially normal to the surface of the substrate. Other embodiments are also claimed and described.

20 Claims, 4 Drawing Sheets

OTHER PUBLICATIONS

Restoin Christine et al., "Electron-beam Poling on Ti:LiNb $O_3$," Applied Optics, vol. 40, No. 33, Nov. 20, 2001, pp. 6056-6061.

Zhu, W.J. et al. "Effect of Al Inclusion in $HfO_2$ on the Physical and Electrical Properties of the Dielectrics," IEEE Electron Device Letters, vol. 23, No. 11, Nov. 2002, pp. 649-651.

Calvin III, Ralph et al. "Semiconductor Technologies for 2025, Needs, Challenges and Opportunities," Electrical and Computer Engineering Honor Society, pp. 4-5, Nov. 2002.

Leong, Meikei et al., "Silicon Device Scaling to the Sub-10-nm Regime," Science, vol. 306, Dec. 17, 2004, pp. 2057-2060.

Shaikh, Aziz S. et al., "Kinetics of $BaTiO_3$ and $Pb\,TiO_3$ Formation from Metallo-organic Precursors," Journal of the American Ceramic Society, vol. 69, No. 9, Sep. 1986, pp. 682-688.

Dennard, Robert H. et al., "Design of Ion-Implanted MOSFET's with Very Small Physical Dimensions," IEEE Journal of Solid-State Circuits, vol. SC-9, No. 5, Oct. 1974, pp. 256-268.

Xu, Zhen et al., "Constant Voltage Stress Induced Degradation in $HfO_2/SiO_2$ Gate Dielectric Stacks," Journal of Applied Physics, vol. 91, No. 12, Jun. 15, 2002, pp. 10127-10129.

Wilk, G.D. et al., "High-K Gate Dielectrics: Current Status and Materials Properties Considerations," Journal of Applied Physics, vol. 89, No. 10, May 15, 2001, pp. 5243-5275.

Zhu, Feng et al., "Improving Channel Carrier Mobility and Immunity to Charge Trapping of High-K NMOSFET by Using Stacked $Y_2O_3/HfO_2$ Gate Dielectric," IEEE Electron Device Letters, vol. 26, No. 12, Dec. 2005, pp. 876-878.

Yang, C.W. et al. "Effect of Polycrystalline-Silicon Gate Types on the Opposite Flatband Voltage Shift in N-Type and P-Type Metal-Oxide-Semiconductor Field-Effect Transistors for High-K-$HfO_2$ Dielectric," Applied Physics Letters, vol. 83, No. 2, Jul. 14, 2003, pp. 308-310.

Yashima Masatomo et al., "Crystal Structure of the High-Temperature Paralectric Phase in Barium Titanate $BaTi_2O_5$," Applied Physics Letters 87, 101909, 2005, pp. 101909-1-101909-3.

Eisenbeiser, K. et al. "Field Effect Transistors with $SrTiO_3$ Gate Dielectric on Si," Applied Physics Letters, vol. 76, No. 10, Mar. 6, 2000, pp. 1324-1326.

Kumazawa, Hidehiro et al., "Fabrication of Barium Titanate Thin Films with a High Dielectric Constant by a Sol-Gel Technique," Thin Solid Films 353, 1999, pp. 144-148.

Wang, J.C. et al., "A Physical Model for the Hysteresis Phenomenon of the Ultrathin $ZrO_2$ Film," Journal of Applied Physics, vol. 92, No. 7, Oct. 1, 2002, pp. 3936-3940.

Tang, Shaoping et al., "Evaluating the Minimum Thickness of Gate Oxide on Silicon Using First-Principles Method," Applied Surface Science 135, 1998, pp. 137-142.

* cited by examiner ively oxide thickness as well as good stability and reliability on the substrate. It is to the provision of such materials, devices, and methods that the various embodiments of the present invention are directed.

HIGH DIELECTRIC CONSTANT INSULATORS AND ASSOCIATED FABRICATION METHODS

CROSS-REFERENCE TO RELATED APPLICATION

The present application claims the benefit of U.S. Provisional Patent Application Ser. No. 60/763,284, filed 30 Jan. 2006, and entitled "High-K Gate Oxide Dielectrics Based on Nanostructured Layers," which is hereby incorporated by reference in its entirety as if fully set forth below.

TECHNICAL FIELD

The various embodiments of the present invention relate generally to dielectric materials, and more particularly, to devices comprising high-dielectric-constant (k) materials, and to methods of making such materials and devices.

BACKGROUND

Silicon dioxide ($SiO_2$) has been used as the primary gate-dielectric material in field effect devices for almost 50 years. However, it is projected, for example, that metal oxide semiconductor (MOS) field effect transistors (FETs) will have gate lengths of less than about 10 nanometers (nm) and will require equivalent oxide thicknesses of $SiO_2$ of about 0.5 nm or less than about 3 atomic layers. The minimum equivalent oxide thickness of $SiO_2$ has been estimated to be about 0.7 nm. Such thin oxide layers represent a fundamental challenge to the historic steady reduction in integrated circuit sizes that have characterized the very successful semiconductor industry. Specifically, at these small thicknesses, the amount of current leakage, which is caused by direct tunneling of charge carriers through the thin oxide layer, may be too high.

Since the capacitance of the oxide layer is proportional to the dielectric constant and inversely proportional to its thickness, using a higher dielectric constant material allows a proportionally greater thickness to be used. High dielectric-constant (high-k) materials, or materials having a dielectric constant greater than that of $SiO_2$ (i.e., 3.9), are clearly needed for silicon (Si) based MOS technologies since the above equivalent oxide thickness are too small to be practically implemented with $SiO_2$. High-k insulators, or high-k dielectrics, are needed to compensate for gate current increases that result from the scaling down of gate oxide thicknesses. Such dielectrics are even more important for low-power circuits where gate leakage power consumption represents a fundamental limitation.

One approach to implementing high-k dielectrics is to use oxides of hafnium (e.g., $HfO_2$), tantalum (e.g., $Ta_2O_5$), lanthanum (e.g., $La_2O_3$), and zirconium (e.g., $ZrO_2$) or nitrides of hafnium (e.g., HfSiON) or tantalum (e.g., TaN). The dielectric constants of these amorphous materials are about 5 to about 20. These materials in their current implementation, however, have reliability issues associated with them. Specifically, charge trapping effects can cause transistor degradation, and channel carrier mobility and transconductance may be degraded. Stacks or laminates of these oxides may provide improved performance. However, since stacked layers may be represented as capacitors in series, the equivalent oxide thickness will never be less than that of the lowest dielectric constant layer.

Accordingly, there is a need for improved high-k materials, high-k electrical devices manufactured therefrom, and associated fabrication methods that exhibit a suitably small effective oxide thickness as well as good stability and reliability on the substrate. It is to the provision of such materials, devices, and methods that the various embodiments of the present invention are directed.

BRIEF SUMMARY

Various embodiments of the present invention are directed to high-dielectric-constant (k) materials and electrical devices implementing the high-k materials. Some embodiments are also directed to methods of making high-k materials and devices. When discussing the various embodiments of the present invention, reference is sometimes made to high-dielectric-constant materials, high dielectric constant insulating materials, high-k dielectrics, high-k insulators, and the like. It should be noted that these terms are intended to be used interchangeably to generally refer to materials having a dielectric constant greater than 3.9.

As discussed in more detail below, certain embodiments of the present invention can be implemented as field effect transistors (FETs), and in particular metal oxide semiconductor field effect transistors (MOSFETs). The various embodiments of the present invention can be fabricated using certain physical process as well as chemical techniques.

Broadly described, an electrical device according to an embodiment of the present invention can include a substrate and a crystalline-oxide-containing composition. The crystalline-oxide-containing composition can be disposed on a surface of the substrate. Within the crystalline-oxide-containing composition, oxide anions can form at least one of a substantially linear orientation or a substantially planar orientation. A plurality of these substantially linear orientations of oxide anions or substantially planar orientations of oxide anions can be oriented substantially perpendicular or normal to the surface of the substrate such that the oxide-containing composition has a dielectric constant greater than about 3.9 in a direction substantially normal to the surface of the substrate. Other embodiments are also claimed and described.

A field effect transistor according to an embodiment of the present invention can include a source, a drain, a body, and a gate. The gate includes a gate dielectric and a gate electrode that is disposed on the gate dielectric. The gate dielectric comprises a crystalline-oxide-containing composition, which is disposed on a surface of the body. Within the crystalline-oxide-containing composition of the gate dielectric, a plurality of lines of oxide anions, zigzagged lines of oxide anions, helices of oxide anions, planes of oxide anions, zigzagged planes of oxide anions, or a combination comprising at least one of the foregoing, are oriented substantially normal to the surface of the body. The dielectric constant of the gate dielectric can be greater than about 3.9 in a direction substantially normal to the surface of the body.

A method of fabricating an electrical device according to an embodiment of the present invention can include providing a substrate and disposing a crystalline-oxide-containing composition on a surface of the substrate. Disposing the crystalline-oxide-containing composition comprises disposing a plurality of lines of oxide anions, zigzagged lines of oxide anions, helices of oxide anions, planes of oxide anions, zigzagged planes of oxide anions, or a combination comprising at least one of the foregoing, substantially normal to the surface of the substrate to provide a dielectric constant greater than about 3.9 in a direction substantially normal to the surface of the substrate.

Other aspects and features of embodiments of the present invention will become apparent to those of ordinary skill in the art, upon reviewing the following detailed description in conjunction with the accompanying figures.

DETAILED DESCRIPTION

Figure 1:
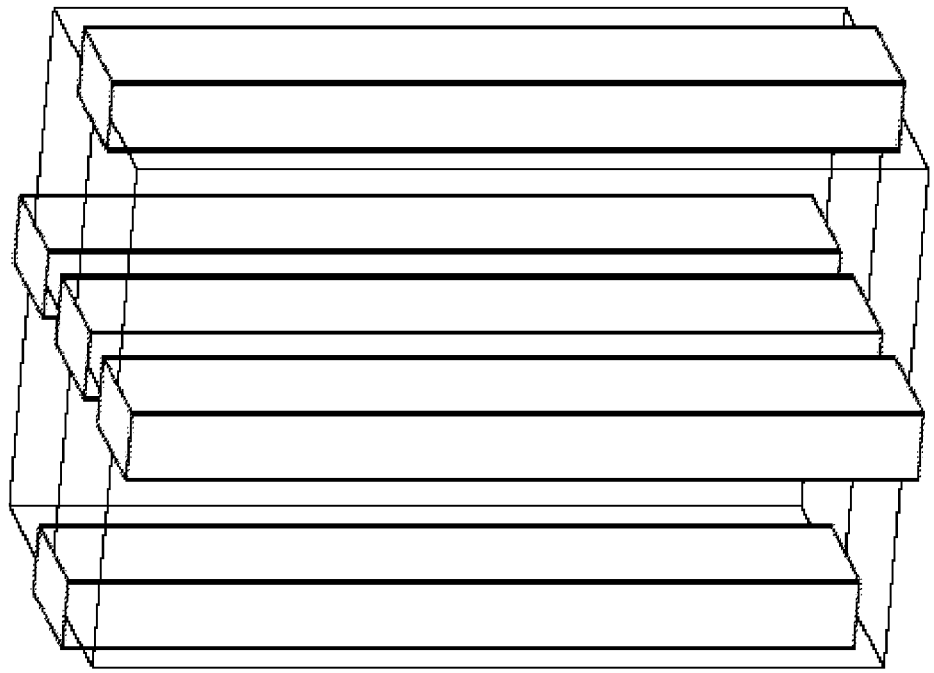
FIG. 1 schematically illustrates linear chains of oxide anions oriented perpendicular to the surface of the substrate according to some embodiments of the present invention.
Figure 1:
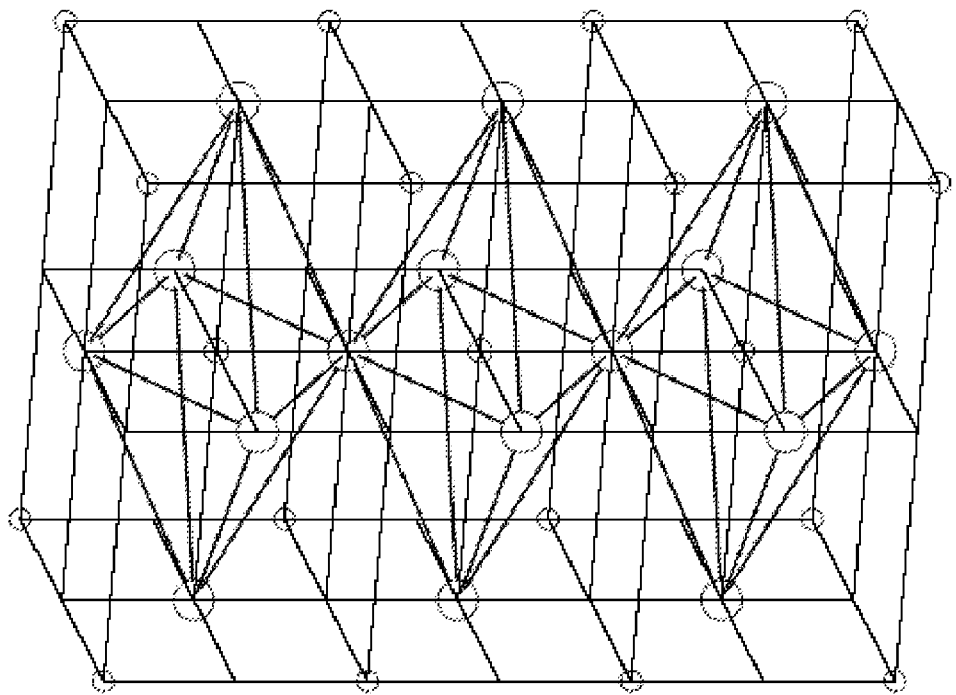

Referring now to the figures, wherein like reference numerals represent like parts throughout the several views, exemplary embodiments of the present invention will be described in detail. Throughout this description, various components may be identified having specific values or parameters, however, these items are provided as exemplary embodiments. Indeed, the exemplary embodiments do not limit the various aspects and concepts of the present invention as many comparable parameters, sizes, ranges, and/or values may be implemented. The terms "first," "second," and the like, "primary," "secondary," and the like, do not denote any order, quantity, or importance, but rather are used to distinguish one element from another. Further, the terms "a", "an", and "the" do not denote a limitation of quantity, but rather denote the presence of "at least one" of the referenced item.

The various embodiments of the present invention provide improved high-k materials, high-k electrical devices, and associated material and device fabrication methods. The electrical devices incorporate a novel approach to producing high-k dielectric materials. Whereas other high-k gate dielectrics have been based primarily on the dielectric's composition, the structures and devices of the embodiments of the present invention are based on the orientation and position/density of oxygen anions within the dielectric material.

Generally, the dielectric constant of a material depends on the magnitude of the electric polarization that is induced within the dielectric material. This induced polarization depends, in turn, on the local electric field within the material. The local electric field is the sum of the external applied electric field and the localized electric field due to any induced dipoles. The induced field is strongly dependent on the atomic environment in the material (i.e., the relative positions of the atoms in the layer). A single structure can give rise to induced fields that are strongly polarizing (e.g., to produce a high-k dielectric) or can give rise to induced fields that are strongly depolarizing (e.g., to produce a dielectric with a lower dielectric constant). Thus, the structure can have anisotropic dielectric properties.

Figure 2:
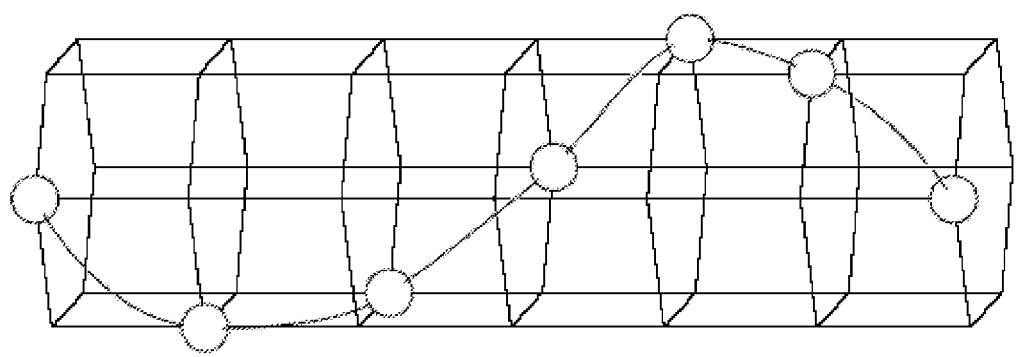
FIG. 2 schematically illustrates a helical chain of oxide anions oriented perpendicular to the surface of the substrate according to some embodiments of the present invention.
Figure 3:
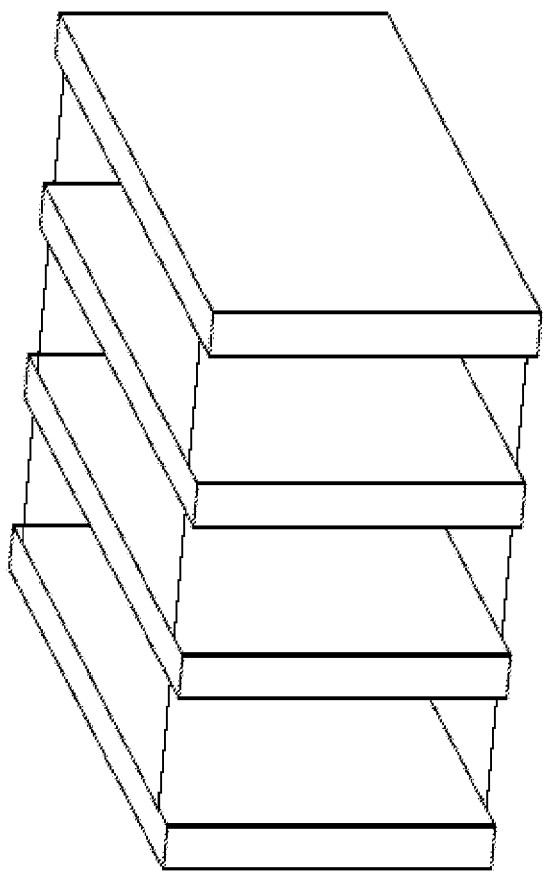
FIG. 3 schematically illustrates a plane of oxide anions oriented perpendicular to the surface of the substrate according to some embodiments of the present invention.
Figure 3:
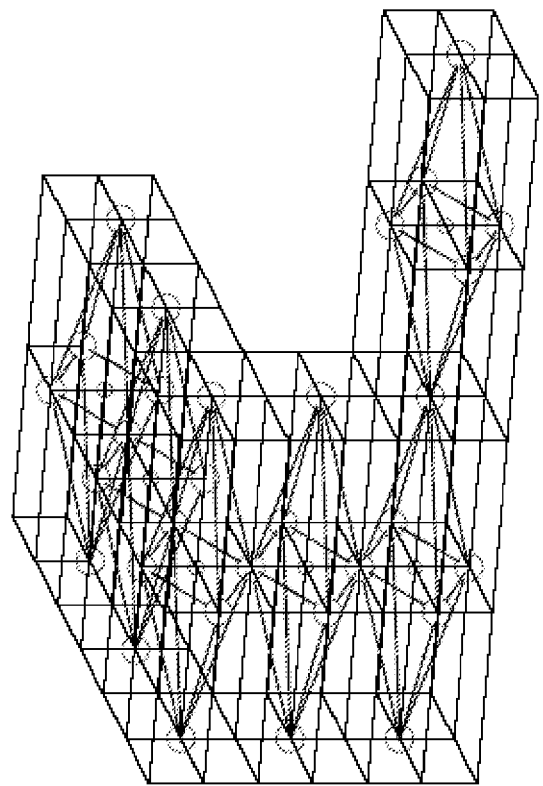

For oxide anions, the highest dielectric constant will occur for a linear "chain" of oxide anions with the electric field being applied along the line of the oxide anions. A high dielectric constant layer can be produced by positioning the oxide anions in non-interacting (i.e., sufficiently separated) linear chains perpendicular to the surface of a substrate. This is illustrated in FIG. 1. In this example, the highest possible dielectric constant is achieved for a field applied perpendicular to the substrate, such as in the case of a gate of a transistor. Other orientations of oxide anions can result in a material having a high dielectric constant in a direction parallel to that of the electric field. For example, FIG. 2 illustrates a helix of oxide anions and FIG. 3 illustrates planes of oxide anions.

An exemplary electrical device according to the present invention comprises a substrate and an oxide-containing composition. The oxide-containing composition can be disposed on a surface of the substrate. Within the oxide-containing composition, oxide anions can form at least one of a substantially linear orientation or a substantially planar orientation. As used herein, the phrase "substantially linear orientations" is intended to include, but not be limited to, linear chains of oxide anions, zigzagged chains or lines of oxide anions, helices of oxide anions, and the like. Also, as used herein, the phrase "substantially planar orientations" is intended to include, but not be limited to, planes of oxide anions, zigzagged planes of oxide anions, and the like. A plurality of these substantially linear orientations of oxide anions or substantially planar orientations of oxide anions can be oriented substantially perpendicular (or normal) to the surface of the substrate such that the oxide-containing composition has a dielectric constant greater than about 3.9 in a direction substantially normal to the surface of the substrate. As used herein, the terms "substantially perpendicular" or "substantially normal" include variations from 90 degrees of up to about 10 degrees. Preferably, these deviations from 90 degrees are less than or equal to about 5 degrees.

The dielectric material is crystalline, at least on the nanometer scale, and can exhibit long range order on the micrometer, or greater, scale. Accordingly, the oxide containing composition is disposed on the surface of the substrate in the form of a plurality of crystallites (i.e., polycrystalline) or as a single crystal. The nanometer scale, or larger, crystallites of the oxide-containing composition are arranged on the surface of the substrate to effect the desired orientation of oxide anions normal to the surface of the substrate. The arrangement of the oxide-containing composition can be controlled by an appropriate fabrication technique.

The oxide anions, which are in the desired geometry (e.g., line, zigzagged line, helix, plane, zigzagged plane, or the like), interact strongly with neighboring oxide anions within the same given geometry, but only weakly with oxide anions from other particular geometries (i.e., another line, zigzagged line, helix, plane, or the like), provided that there is sufficient separation between the different geometrical orientations of oxide anions. Since the electric field of an induced dipole varies inversely proportional to the cube of the distance from the dipole, it follows that nearby oxide anions can be strongly interacting and those oxide anions only slightly farther away can be weakly interacting. Thus, small changes in atomic positions can produce large changes in the dielectric constant. By way of example, the oxide anions within one line of oxide anions dielectrically interact strongly with neighboring oxides within the same line, but only weakly with the oxide anions in another line or within a different oxide anion geometry within the oxide-containing composition. Thus, for electric fields that are normal or substantially normal to the surface of the substrate, the oxide-containing composition operates as a high-k insulator. In one embodiment, the oxide-containing composition has a dielectric constant greater than or equal to about 50 in a direction substantially normal to the surface of the substrate. In another embodiment, the oxide-containing composition has a dielectric constant greater than or equal to about 100 in a direction substantially normal to the surface of the substrate.

Oxide anions, in crystalline solids, are generally arranged at the corners of an octahedron or tetrahedron with a metal cation at the center. An octahedron can interact with another octahedron, or a tetrahedron, by sharing a corner, an edge, or a three-sided face. Similarly, a tetrahedron can interact with another tetrahedron, or an octahedron, by sharing a corner, an edge, or a three-sided face. The interactions between the polyhedra are dictated, in part, by the particular metal ion in the center of the polyhedron as well as any other components of the composition of the solid (e.g., substituents in the polyhedron, ions in the vicinity of the octahedron, ion vacancies, dopants, and the like). Based on these interactions between polyhedra, and/or other components of the composition of the solid, there can be a distortion of one or more of the dimensions of a polyhedron. There can also be a distortion in the arrangement of the polyhedra with respect to each other, such that certain polyhedra are canted or skewed towards one another. The unit cell for a particular crystal structure and composition will include each of these distortions. Thus, each crystallite, which comprises a plurality of three-dimensionally arranged unit cells, will have very specific, periodic, and regular arrangements of oxide anions. Taking advantage of these geometric arrangements and the inverse cube interaction of oxide anions within the crystallite, and properly orienting the individual crystallite(s) on the surface of the substrate allows the formation of the high-k materials and devices according to some embodiments of the present invention.

By way of example, if two of the axes of an octahedron are expanded and the third is compressed, such as is shown in FIG. 1, and a plurality of corner-sharing octahedra of this type are stacked along the compressed axis, the distance between the compressed oxide anions is sufficient for them to interact strongly dielectrically. This two-dimensional interaction generally results in a linear chain of oxide anions. The oxide anions of each of the elongated axes also strongly interact with oxide anions of elongated axes other octahedra stacked above and below them to form their own lines of oxide anions. These lines of oxide anions are too far from the oxide anions of the line of the compressed axis to act in a depolarizing manner. Therefore, a plurality of parallel lines of oxide anions is formed.

If, for example, another ion were repeatedly placed in one or more of the gaps between the corner-sharing octahedra, there could be enough of an electrostatic repulsion between the octahedra and the other ion to skew the octahedra. Thus, instead of linear chains of oxide anions, there would be "kinks" in each line such as to form zigzagged lines of oxide anions. Another way of generating zigzagged lines of oxide anions would be to substitute one of the oxide anions in each octahedron with another anion, which could allow the same coordination geometry (e.g., sulfur) or require a different coordination geometry (e.g., nitrogen), so as to provide different electrostatic interactions between octahedra. In this case, substitution of the oxide anion(s) with another anion(s) would change the overall number of zigzagged chains of oxide anions as well.

By way of another example, if only one of the axes of an octahedron are expanded and the other two are compressed, such as is shown in FIG. 3, and a plurality of corner-sharing octahedra of this type are stacked along one of the compressed axes, the distance between the four compressed oxide anions is sufficient for them to strongly interact dielectrically. This two-dimensional interaction actually results in a plane of polarizing oxide anions. The oxide anions of the elongated axes may or may not also strongly interact with oxide anions of elongated axes other octahedra stacked above and below them to form their own planes of oxide anions. These planes of oxide anions are too far from the oxide anions of the planes of the compressed axes to interact in a depolarizing manner.

Therefore, a plurality of parallel planes of oxide anions is formed. Alternatively, planes of oxide anions are also created if a plurality of these octahedra interacts in an edge-sharing manner.

Similarly, if another ion were repeatedly placed in one or more of the gaps between the edge-sharing octahedra, there could be enough of an electrostatic repulsion between the octahedra and the other ion to skew the octahedra. Thus, instead of planar chains of oxide anions, there would be "kinks" in each plane such as to form zigzagged planes of oxide anions. Analogously, another way of generating zigzagged planes of oxide anions would be to substitute one of the non-edge shared oxide anions in each octahedron with another anion, which could allow the same coordination geometry (e.g., sulfur) or require a different coordination geometry (e.g., nitrogen), so as to provide different electrostatic interactions between octahedra. In this case, however, substitution of the oxide anion(s) with another anion(s) could, but would not necessarily, change the overall number of zigzagged planes of oxide anions too.

The threshold distance between oxide anions, or between closest points of geometric arrangements of oxide anions, over which they would no longer be interacting to have a depolarizing effect depends on the particular geometric arrangement of oxide anions.

The cations of the oxide-containing compositions can include lithium, magnesium, silicon, lead, niobium, titanium, strontium, sodium zirconium, lanthanum, hafnium, barium, yttrium, scandium, iodine, calcium, or the like, or a combination comprising at least one of the foregoing (e.g., barium and titanium, strontium and titanium, lithium and iodine, and the like). Additional anions that can be present in the oxide-containing composition include, sulfur, nitrogen, iodine, or the like, or a combination comprising at least one of the foregoing. Additionally, if desired, dopants may be incorporated into the oxide-containing composition to provide it with a positive polarity (p-type) or negative polarity (n-type). The elemental composition should be chosen to optimize the dielectric constant and the electron tunneling characteristics of the resulting high-k dielectric structure for desired performance characteristics.

Specific oxide-containing compositions that can be implemented in the devices of the present invention (i.e., with the desired oxide anion geometries) include lithium niobate, lithium iodate, hafnium oxide, hafnium silicon oxide, lanthanum oxide, lanthanum aluminum oxide, zirconium oxide, zirconium silicon oxide, tantalum oxide, barium strontium titanate, barium strontium niobate, barium titanate, strontium titanate, yttrium oxide, aluminum oxide, lead scandium tantalum oxide, barium sodium niobate, or lead zinc niobate. Exemplary oxide-containing compositions include $LiNbO_3$, $BaTi_2O_5$, $Ca_{0.25}Ba_{0.75}Nb_2O_6$, $LiIO_3$, $Ba_2NaNb_5O_{15}$, $SrTiO_3$, $BaTiO_3$, and $Ba_{0.25}Sr_{0.75}Nb_2O_6$.

For example, lithium niobate ($LiNbO_3$) is characterized by containing periodic planar hexagonal layers of oxide anions. For an electric field applied parallel to one plane, the dielectric constant is about 78. The dielectric constant would be significantly lower for a field applied perpendicular to the plane. However, if oriented properly such that it approximates a plurality of chains parallel to the electric field, it could have a dielectric constant of about 104.

There are many possible fabrication methods that can be used individually or in combination to produce the disclosed structures. Fabrication methods include both chemical and physical processes. A non-exhaustive list of processes includes chemical vapor deposition (CVD), metal organic chemical vapor deposition (MOCVD), combustion chemical vapor deposition, molecular beam epitaxy (MBE), radio frequency sputtering, magnetron sputtering, electron beam bombardment, electrostatic deposition, floating zone crystal growth, atomic layer deposition, self-assembly methods, and the like. Various processing steps may be utilized before deposition, during deposition, or post-deposition, such as sintering, electric field poling, application of pressure, masking, templating, annealing, ozone treatment, ion diffusion, and the like. Each of the foregoing techniques is known to those skilled in the art to which this disclosure pertains.

The substrate, which can comprise any semiconducting material (e.g., silicon, germanium, gallium arsenide, or the like), can undergo a mechanical treatment such that the surface has a particular crystallographic plane (represented by Miller indices). By providing the surface of the substrate with a specific crystallographic plane, growth of the oxide-containing composition with the desired atomic arrangement can be facilitated. Furthermore, the oxide-containing layer can be grown epitaxially on the surface of the substrate.

It should be noted that any of these fabrication processes or processing steps can be carried out in the presence of an electric and/or magnetic field in order to facilitate orienting the oxide-containing composition on the surface of the substrate as desired.

As stated above, the oxide-containing composition is disposed on the surface of the substrate in the form of a plurality of crystallites (i.e., polycrystalline) or as a single crystal. If the oxide-containing composition is polycrystalline, each grain of the polycrystalline-oxide-containing composition will comprise a plurality of lines of oxide anions, zigzagged lines of oxide anions, helices of oxide anions, planes of oxide anions, zigzagged planes of oxide anions, or a combination comprising at least one of the foregoing. In an exemplary embodiment, the geometric arrangement of the oxide anions for every grain or crystallite is substantially normal to the surface of the substrate.

The overall thickness of the oxide-containing composition can be larger than that seen in conventional electronic devices owing to its high dielectric constant. However, the overall thickness of the high-k oxide-containing composition is desirably about 1 nm to about 100 nm. More specifically, the overall thickness of the high-k oxide-containing composition is about 1 nm to about 10 nm.

Figure 4:
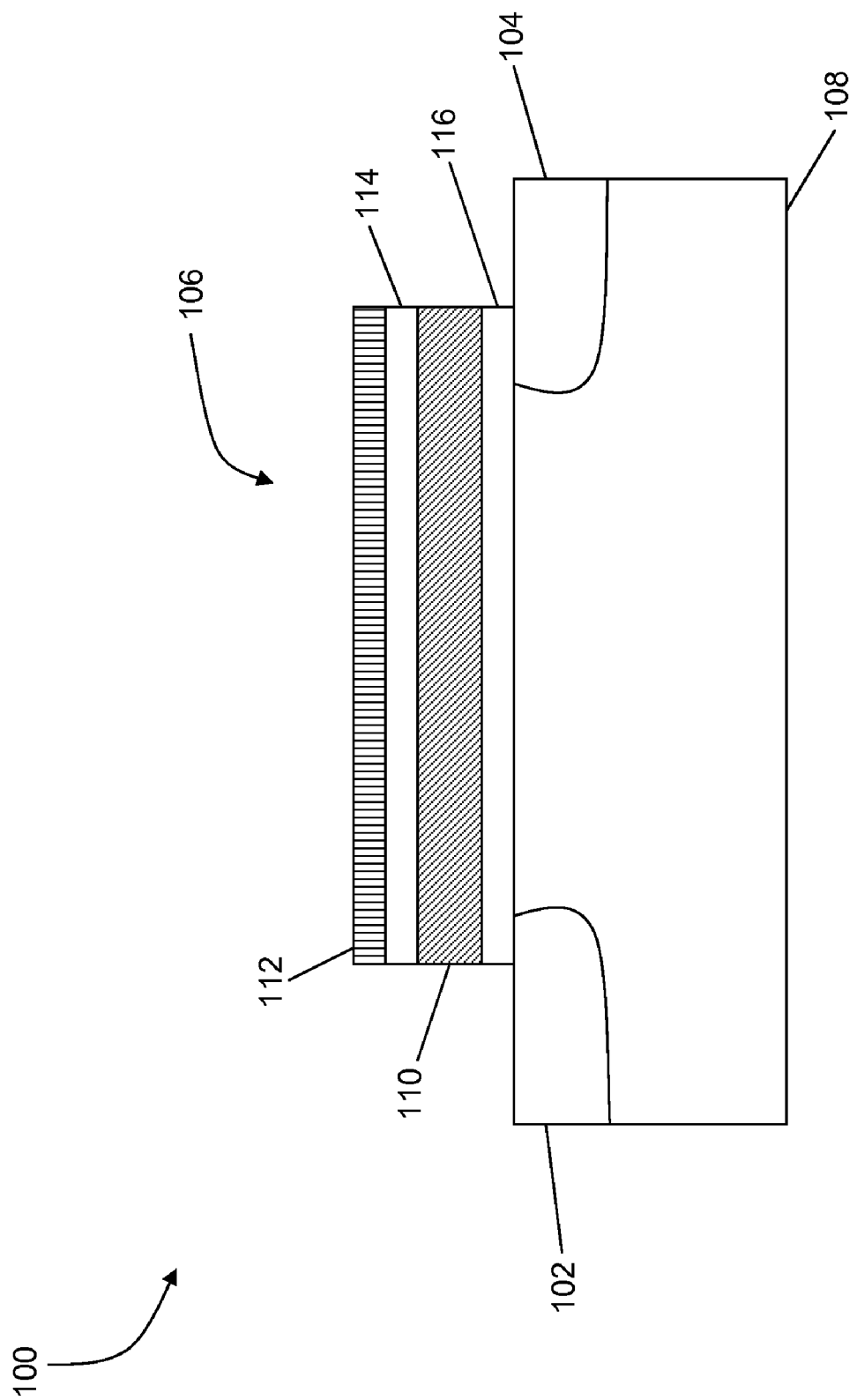
FIG. 4 schematically illustrates a transistor device according to some embodiments of the present invention.

The electrical device including the substrate and the high-k oxide containing composition can be implemented in a field effect transistor (FET) to control the shape and conductivity of the channel in a semiconductor. An exemplary FET is shown in FIG. 4 and generally indicated by 100. The FET 100 includes a source 102, a drain 104, a gate 106, and a body 108. The gate 106 includes a gate dielectric 110, which is the high-k oxide-containing composition described above. The substrate for the high-k oxide-containing composition is the body 108 of the FET 100. The gate 106 further includes a gate electrode 112 disposed on the gate dielectric 110. The gate may include optional barrier or buffer layers 114 and 116 disposed between the gate dielectric 110 and the gate electrode 112 and between the gate dielectric 110 and the body 108, respectively. If the gate electrode 112 is a metal, then the FET 100 is a metal oxide semiconductor field effect transistor (MOSFET).

The embodiments of the present invention are not limited to the particular formulations, process steps, and materials disclosed herein as such formulations, process steps, and materials may vary somewhat. Moreover, the terminology employed herein is used for the purpose of describing exemplary embodiments only and the terminology is not intended to be limiting since the scope of the various embodiments of the present invention will be limited only by the appended claims and equivalents thereof. For example, temperature and pressure parameters may vary depending on the particular materials used.

Therefore, while embodiments of this disclosure have been described in detail with particular reference to exemplary embodiments, those skilled in the art will understand that variations and modifications can be effected within the scope of the disclosure as defined in the appended claims. Accordingly, the scope of the various embodiments of the present invention should not be limited to the above discussed embodiments, and should only be defined by the following claims and all equivalents.

What is claimed is:

1. An electrical device, comprising:
a crystalline-oxide-containing composition disposed on a surface of a substrate, the crystalline-oxide-containing composition comprising a plurality of substantially linear orientations of oxide anions or a plurality of substantially planar orientations of oxide anions, wherein the plurality of substantially linear orientations of oxide anions or substantially planar orientations of oxide anions are substantially normal to the surface of the substrate, wherein the crystalline-oxide-containing composition has a dielectric constant greater than about 3.9 in a direction substantially normal to the surface of the substrate, and wherein each one of the plurality of substantially linear orientations of oxide anions or substantially planar orientations of oxide anions does not substantially interact with another one of the plurality of substantially linear orientations of oxide anions or substantially planar orientations of oxide anions with the result being that the dielectric constant of the crystalline-oxide-containing composition is not decreased in a direction substantially normal to the surface of the substrate.

2. The electrical device of claim 1, wherein the plurality of substantially linear orientations of oxide anions or substantially planar orientations of oxide anions comprises a plurality of lines of oxide anions, zigzagged lines of oxide anions, helices of oxide anions, planes of oxide anions, or zigzagged planes of oxide anions.

3. The electrical device of claim 1, wherein the substrate comprises a semiconductor.

4. The electrical device of claim 1, wherein the oxide-containing composition is a single crystal.

5. The electrical device of claim 1, wherein the oxide-containing composition is polycrystalline, and each crystallite of the polycrystalline-oxide-containing composition comprises the plurality of oxide anions arranged in at least one of the substantially linear or substantially planar orientations that are oriented substantially normal to the surface of the substrate.

6. The electrical device of claim 1, wherein the dielectric constant is greater than or equal to about 50 in the direction substantially normal to the surface of the substrate.

7. The electrical device of claim 1, wherein the dielectric constant is greater than or equal to about 100 in the direction substantially normal to the surface of the substrate.

8. The electrical device of claim 1, wherein the overall thickness of the oxide-containing composition is about 1 nanometer to about 100 nanometers.

9. The electrical device of claim 1, further comprising a barrier layer disposed between the crystalline-oxide-containing composition and the substrate.

10. A field effect transistor, comprising:
a source;
a drain;
a body; and
a gate comprising a gate dielectric and a gate electrode disposed on the gate dielectric, the gate dielectric comprising a crystalline-oxide-containing composition disposed on a surface of the body, wherein the crystalline-oxide-containing composition comprises a plurality of lines of oxide anions, zigzagged lines of oxide anions, helices of oxide anions, planes of oxide anions, zigzagged planes of oxide anions, or a combination comprising at least one of the foregoing, oriented substantially normal to the surface of the body to provide a dielectric constant greater than about 3.9 in a direction substantially normal to the surface of the body, and wherein oxide anions in one of the plurality of lines of oxide anions, zigzagged lines of oxide anions, helices of oxide anions, planes of oxide anions, zigzagged planes of oxide anions, or a combination comprising at least one of the foregoing, interact strongly with neighboring oxide anions within the same one of the plurality of lines of oxide anions, zigzagged lines of oxide anions, helices of oxide anions, planes of oxide anions, zigzagged planes of oxide anions, or a combination comprising at least one of the foregoing, and interact weakly with oxide anions from another one of the plurality of lines of oxide anions, zigzagged lines of oxide anions, helices of oxide anions, planes of oxide anions, zigzagged planes of oxide anions, or a combination comprising at least one of the foregoing, with the result being that the dielectric constant of the crystalline-oxide-containing composition is not decreased in a direction substantially normal to the surface of the substrate.

11. The field effect transistor of claim 10, further comprising a barrier layer disposed between the gate dielectric and the gate electrode.

12. The field effect transistor of claim 10, further comprising a barrier layer disposed between the gate dielectric and the body.

13. The field effect transistor of claim 10, wherein the gate electrode is a metal, and the field effect transistor is a metal oxide semiconductor field effect transistor.

14. The field effect transistor of claim 10, wherein the dielectric constant of the gate dielectric is greater than or equal to about 50 in the direction substantially normal to the surface of the body.

15. The field effect transistor of claim 10, wherein the dielectric constant of the gate dielectric is greater than or equal to about 100 in the direction substantially normal to the surface of the body.

16. A method of fabricating an electrical device, the method comprising:
providing a substrate; and
disposing a crystalline-oxide-containing composition on a surface of the substrate such that a plurality of lines of oxide anions, zigzagged lines of oxide anions, helices of oxide anions, planes of oxide anions, zigzagged planes of oxide anions, or a combination comprising at least one of the foregoing, are oriented substantially normal to the surface of the substrate to provide a dielectric constant greater than about 3.9 in a direction substantially normal to the surface of the substrate;
wherein oxide anions in one of the plurality of lines of oxide anions, zigzagged lines of oxide anions, helices of oxide anions, planes of oxide anions, zigzagged planes of oxide anions, or a combination comprising at least one of the foregoing, interact strongly with neighboring oxide anions within the same one of the plurality of lines of oxide anions, zigzagged lines of oxide anions, helices of oxide anions, planes of oxide anions, zigzagged planes of oxide anions, or a combination comprising at least one of the foregoing, and interact weakly with oxide anions from another one of the plurality of lines of oxide anions, zigzagged lines of oxide anions, helices of oxide anions, planes of oxide anions, zigzagged planes of oxide anions, or a combination comprising at least one of the foregoing, with the result being that the dielectric constant of the crystalline-oxide-containing composition is not decreased in a direction substantially normal to the surface of the substrate.

17. The method of claim 16, wherein disposing the crystalline-oxide-containing composition on the surface of the substrate comprises at least one of chemical vapor deposition, metal organic chemical vapor deposition, combustion chemical vapor deposition, molecular beam epitaxy, radio frequency sputtering, magnetron sputtering, electron beam bombardment, electrostatic deposition, floating zone crystal growth, atomic layer deposition, or self-assembly.

18. The electrical device of claim 1, wherein the crystalline-oxide-containing composition comprises oxide anions at corners of octahedra or tetrahedra, and wherein one or more dimensions of the octahedra or tetrahedra comprising the oxide anions is distorted.

19. The electrical device of claim 1, wherein the crystalline-oxide-containing composition comprises oxide anions at corners of octahedra or tetrahedra, and wherein an arrangement of the octahedra or tetrahedra comprising the oxide anions is distorted such that one or more of the octahedra or tetrahedra are canted or skewed towards one another.

20. The field effect transistor of claim 10, wherein the crystalline-oxide-containing composition comprises oxide anions at corners of octahedra or tetrahedra, and
wherein one or more dimensions of the octahedra or tetrahedra comprising the oxide anions is distorted and/or wherein an arrangement of the octahedra or tetrahedra comprising the oxide anions is distorted such that one or more of the octahedra or tetrahedra are canted or skewed towards one another.

* * * * *